(12) United States Patent
Crippa et al.

(10) Patent No.: US 7,031,191 B2
(45) Date of Patent: Apr. 18, 2006

(54) STABILIZATION METHOD FOR DRAIN VOLTAGE IN NON-VOLATILE MULTI-LEVEL MEMORY CELLS AND RELATED MEMORY DEVICE

(75) Inventors: Luca Crippa, Busnago (IT); Giancarlo Ragone, Turin (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 41 days.

(21) Appl. No.: 10/748,701

(22) Filed: Dec. 30, 2003

(65) Prior Publication Data

US 2004/0213047 A1    Oct. 28, 2004

(30) Foreign Application Priority Data

Dec. 30, 2002   (EP)   ................... 02425801

(51) Int. Cl.
*G11C 16/04*   (2006.01)
(52) U.S. Cl. ............... 365/185.18; 365/185.02; 365/185.28; 365/189.09
(58) Field of Classification Search ............... None
See application file for complete search history.

(56) References Cited

U.S. PATENT DOCUMENTS

| | | | |
|---|---|---|---|
| 5,253,201 A * | 10/1993 | Atsumi et al. | 365/185.23 |
| 5,546,042 A | 8/1996 | Tedrow et al. | 327/538 |
| 5,576,990 A * | 11/1996 | Camerlenghi et al. | 365/185.23 |
| 5,815,435 A * | 9/1998 | Van Tran | 365/185.03 |
| 6,040,993 A * | 3/2000 | Chen et al. | 365/185.03 |
| 6,285,614 B1 | 9/2001 | Mulatti et al. | 365/207 |
| 6,456,557 B1 * | 9/2002 | Dadashev et al. | 365/226 |
| 6,697,288 B1 * | 2/2004 | Kim et al. | 365/189.11 |
| 6,795,352 B1 * | 9/2004 | Tanzawa et al. | 365/189.09 |
| 6,873,554 B1 * | 3/2005 | Nagatomo | 365/189.11 |
| 2002/0101762 A1 | 8/2002 | Nawaki et al. | 365/185.01 |

FOREIGN PATENT DOCUMENTS

EP    0905710    3/1999

OTHER PUBLICATIONS

Tietze, Halbleiter-Schaltungstechnik, 1974, Springer-Verlag, Berlin, pp. 383-388.

* cited by examiner

*Primary Examiner*—Son Mai
(74) *Attorney, Agent, or Firm*—Lisa K. Jorgenson; Allen, Dyer, Doppelt, Milbrath & Gilchrist, P.A.

(57) ABSTRACT

A method and an electronic device for stabilizing the voltage on the drain terminals of multi-level non-volatile memory cells during programming thereof. The voltage is provided by a drain voltage regulator having an output connected to the drain terminals at a common circuit node by a metal line conduction path having a parasitic intrinsic resistance. A feedback path is advantageously provided between the common circuit node and an input of the regulator.

19 Claims, 6 Drawing Sheets

STABILIZATION METHOD FOR DRAIN VOLTAGE IN NON-VOLATILE MULTI-LEVEL MEMORY CELLS AND RELATED MEMORY DEVICE

FIELD OF THE INVENTION

The present invention relates to electronic circuits, and, more particularly, to memory devices and related methods.

BACKGROUND OF THE INVENTION

During programming of a Flash memory cell, it is important to properly set the voltage applied to the various terminals thereof (i.e., gate, source, drain, and body terminals). In the multi-level flash memory field where the cell is programmed at different threshold voltage values, node stability becomes an even more critical problem.

The simple case of programming a multi-level cell with two bits per cell will now be considered, i.e., a two-level cell with four possible combinations of storable logic values. Turning now to FIG. 1, the distributions of four different programming states of such a cell (i.e., the distributions of its possible threshold voltage values), are shown. The programming step of a Flash cell is typically preceded by an erasing step. Consequently, in the beginning the cell is brought to the logic state 11, the state with the lowest threshold.

The programming algorithm may be split into n substantially identical steps. In the first part of each of these steps, the Flash memory cell is biased to keep the drain node at a fixed voltage value (typically +4V), the source node to ground, and the body at a fixed negative value (typically −1.2V). The gate node is initially set at a voltage of 1.5V, and is then increased in subsequent steps, for example, by 300 mV at each further step. This leads to an increase in the cell threshold voltage in steps, as illustrated in FIG. 1.

In the second part of each programming step, the state of the cell is tested through a reading operation (verify). If the cell does not reach the desired distribution, the operation is repeated by increasing the gate voltage. If, on the other hand, the cell threshold voltage reaches the desired distribution, the programming thereof ends.

The programming step typically does not involve only one cell, rather a certain number of cells are programmed in parallel. When one or more cells reach the desired threshold value (i.e., it reaches the desired threshold distribution), they are excluded from the following programming step which continues only for the remaining cells that have yet to reach the predetermined state.

In some fairly recent prior art memory devices, the programming step involves programming about seventy cells in parallel, which results in a variable current load for the drain voltage regulator during the different programming steps. The changes of the threshold voltage and the applied gate voltage cause a different current absorption by the memory cells. Moreover, when the cells have reached the desired state, they are disconnected through a program load transistor, for example, as shown in the schematic circuit diagram of FIG. 2.

It will therefore be understood that the cell drain voltage regulator, in the different programming steps, has to provide a constant voltage value, but in different current load conditions. The drain voltage VPD (+4V) is derived from the band gap reference voltage (VGB) according to the following relation:

$$V_{PD} = V_{BG} \cdot \left(1 + \frac{R_f}{R_g}\right),$$

which expresses the gain of a feedback voltage amplifier in a non-inverting configuration.

The drain regulator, for layout requirements, may be at a certain distance from the program load transistors PL. The interconnection metal line bringing the adjusted voltage VPD to these transistors, inserts a parasitic resistance, quantifiable in some tens of ohms. Considering that each memory cell can absorb a drain current of about 60 µA, with seventy cells being programmed the total current can reach 4 mA. With a parasitic resistance Rpars for the metal line equal to 25 Ω, as shown in FIG. 3, the voltage drop thereon can reach up to 100 mV. Since the cells which have reached the appropriate distribution are disconnected from the adjusted voltage VPD, the cells upon which programming continues may have a drain voltage changed by +100 mV in some cases.

Some typical curves showing the threshold voltage change in the programming step according to different drain voltage values are schematically represented in FIG. 4. In the illustrated diagram, the abscissa indicates the gate voltage, and the ordinate indicates the threshold voltage. If the drain voltage is constant during all of the programming steps, the cell threshold voltage change follows one of these characteristics. If, on the other hand, the drain voltage changes during programming, the threshold voltage change translates in another characteristic. This results in a higher threshold jump and a widening of the distributions associated with the circuit of FIG. 1 with a corresponding decrease in the reading noise margin or, in the worst case, in real failures due to an excessive distribution widening.

SUMMARY OF THE INVENTION

The technical problem underlying the present invention is to provide a method for stabilizing the drain voltage and a corresponding non-volatile memory device having respective functional and structural characteristics which improve the Flash cell drain voltage stability. Moreover, this is to be done while avoiding the use of voltage regulators positioned near the cell drains. As noted above, drain voltage is influenced by the change in the current absorption during the different programming steps.

The premise underlying the present invention is to provide the feedback potential of the voltage regulator corresponding to the program load transistors away from the regulator output. This is done to make the voltage on the load node independent from the parasitic resistance on the metal line and from the variable current load.

The present invention relates to a multi-level, non-volatile memory device monolithically integrated on a semiconductor which may include a programming circuit associated with a matrix of non-volatile memory cells. Each memory cell may be equipped with at lest one floating gate transistor with corresponding source, drain and gate terminals. Each programming circuit may incorporate a drain voltage regulator having an output connected to the cell drain terminals in a common circuit node, and through a metal line conduction path having a parasitic intrinsic resistance.

Furthermore, the invention relates to a method for stabilizing the voltage at both ends of a load among a plurality of loads associated with a supply line, the loads being active one at a time. The application of the voltage may be provided through a voltage regulator having an output connected to the loads by the supply line and a plurality of routing resistances, each being associated with a corresponding load.

BRIEF DESCRIPTION OF THE DRAWINGS

The various features and advantages of the present invention will be further understood from the following description of an embodiment thereof given by way of non-limiting example, with reference to the attached drawings, in which.

DETAILED DESCRIPTION OF THE PREFERRED EMBODIMENTS

Figure 5:
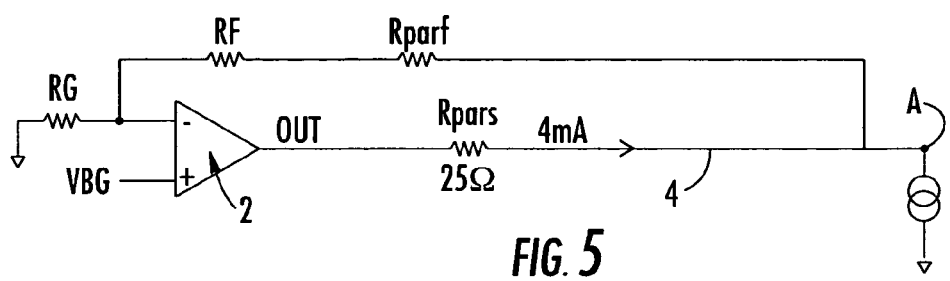
FIG. 5 is a schematic diagram generally illustrating a first embodiment of the present invention.
Figure 6:
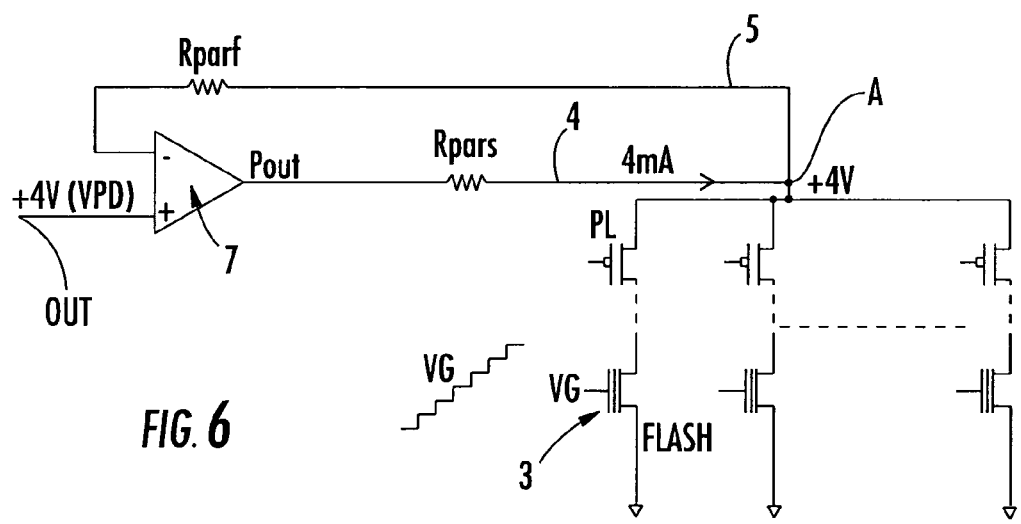
FIG. 6 is a schematic diagram of a second embodiment of the present invention.

Referring now to FIGS. 5 and 6, a circuit portion 1 of an electronic memory device according to the present invention is first described. The circuit portion 1 is structured to locally regulate voltage values on the drain terminals of multi-level non-volatile memory cells 3 during programming thereof. More particularly, the circuit portion 1 refers to a drain regulator 2 connected to a common load circuit node A by a metal line 4.

The memory matrix columns, i.e., the drain terminals of the memory cells 3, are connected to the circuit node A via a respective program load transistor PL. As used herein, "memory device" means any monolithic electronic system incorporating a matrix of memory cells, organized in rows and columns, as well as circuit portions associated with the cell matrix and responsible for the addressing, decoding, reading, writing and/or erasing of the memory cell contents. Such a device may be, for example, a semiconductor-integrated memory chip of the non-volatile EEPROM Flash type split into sectors that is electrically erasable.

Each multi-level memory cell comprises a floating gate transistor with source S, drain D and control gate G terminals. Programming circuits are provided among the circuit portions associated with the cell matrix, and each programming circuit is supplied by a specific supply voltage generated inside the integrated memory circuit and regulated by the drain voltage regulator 2.

In accordance with the present invention, the node A is feedback-connected to an input of the regulator 2. The parasitic resistance $R_{pars}$ on the metal line is therefore substantially incorporated in the feedback loop.

In accordance with a first exemplary embodiment of the invention, the drain voltage regulator 2 is output-connected to the node A by the metal line 4, and has an input feedback-connected to the same node A. A first gain resistor Rf and a second resistance $R_{parf}$ representing the parasitic resistance of the feedback metal line 5 are illustratively indicated on the feedback path.

The series of resistances RF and $R_{parf}$ is thus a resistive value which can be assigned to this feedback connection. The regulator 2 input receiving the feedback is the inverting input (−). The other (non-inverting) input is kept at a stable voltage reference, for example, a bandgap voltage Vbg. This configuration makes the node A voltage independent from the parasitic resistance $R_{pars}$ value, and thus from the variable current load.

As a result, the feedback node advantageously is no longer at the regulator 2 output as in the prior art, but it is instead near the program load transistors PL. The interconnection parasitic resistance $R_{pars}$ is thus incorporated inside the feedback loop. Moreover, since the node OUT is no longer fed back to the inverting amplifier input, but instead the node A is fed back, this allows a voltage value regulated to 4V to be kept on the node A. More particularly, the voltage is not regulated to 4V at the voltage regulator 2 output, but at the load node A. The node OUT is thus regulated by the feedback to obtain 4V on the node A.

The voltage at the node OUT will vary based upon the load current according to the following relation:

$$V_{OUT} = Iload * Rpar + V_{NODA};$$

while the voltage on node A satisfies the following formula:

$$VnodoA = V_{BG} \cdot \left(1 + \frac{R_f + R_{parf}}{R_g}\right),$$

where Rparf is the parasitic resistance of the feedback metal line 5 (which is typically equal to about a few hundred ohms), and it can be also ignored if Rf is high enough. This parasitic resistance Rparf, once estimated, does not cause voltage changes at the node A since the load current does not flow in this resistance.

Turning more particular to the example illustrated in FIG. 6, an alternative embodiment of the present invention is now described. In this second embodiment a unitary gain buffer 7, for example, of the voltage-follower type, is inserted immediately downstream of the drain voltage regulator 2. This embodiment, while preserving the advantages of the previous solution, has the further advantage of substantially eliminating the effect of the parasitic resistance $R_{parf}$ of the feedback metal line 5.

More specifically, the feedback node A is connected once again downstream of the resistance $R_{pars}$ and not at the regulator 2 output. This keeps the voltage upstream of the program load transistors equal to the voltage VPD at inputting buffer 7, and the gain (unitary) of the latter is not influenced by the resistance $R_{parf}$.

Figure 1:
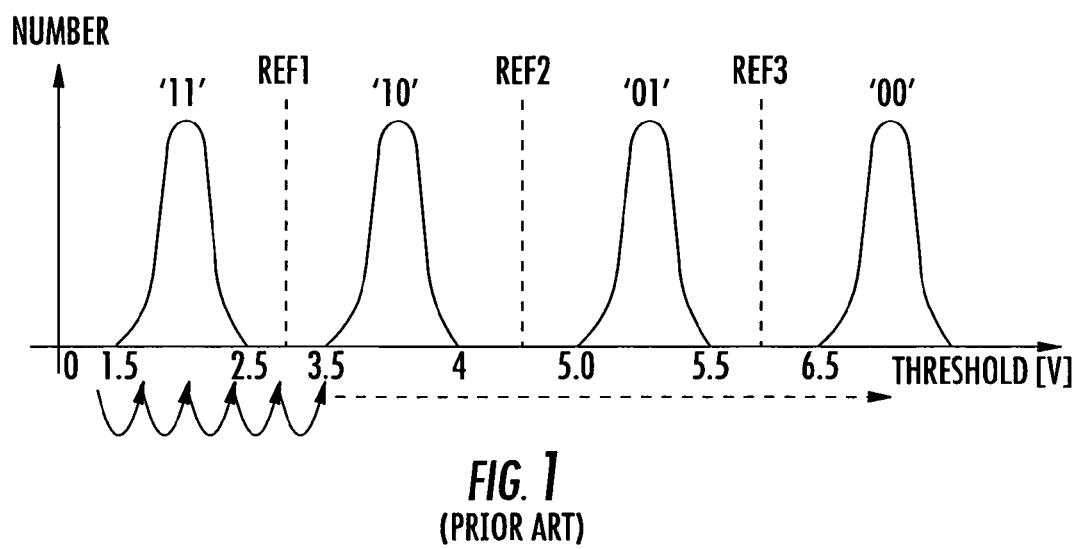
FIG. 1 is a diagram illustrating the threshold voltage distribution in a prior art two-level memory cell with two bits per cell.
Figure 2:
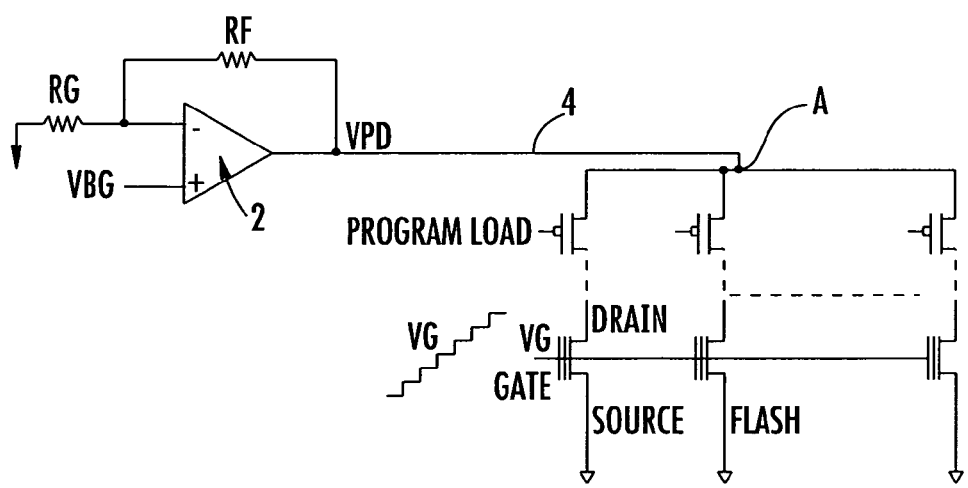
FIGS. 2 and 3 are schematic diagrams of prior art programming circuits of the program-load type.
Figure 3:
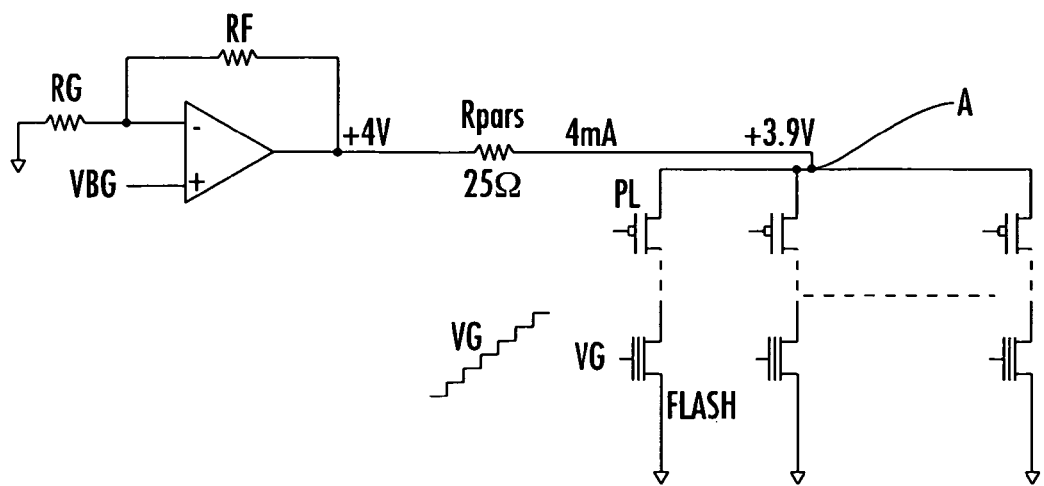
Figure 4:
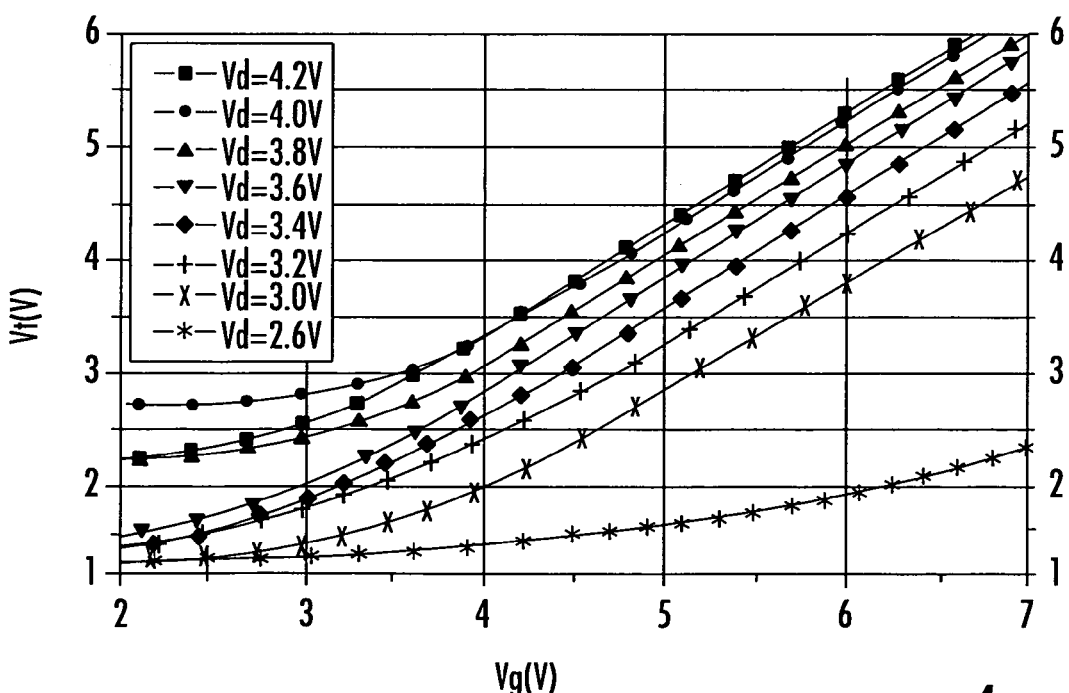
FIG. 4 is a voltage/voltage diagram illustrating curves which are typical of a prior art multi-level memory cell.
Figure 7A:
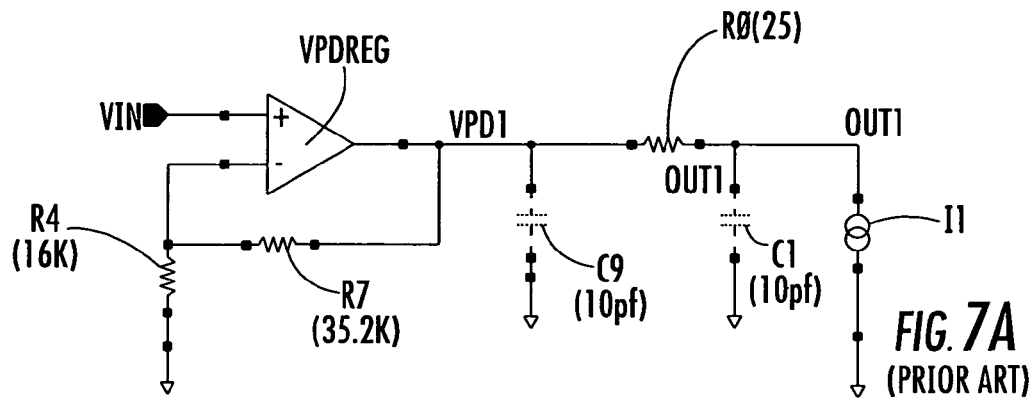
FIGS. 7A and 7B are schematic diagrams illustrating a circuit according to the prior art and according to the present invention, respectively, for comparison purposes.
Figure 7B:
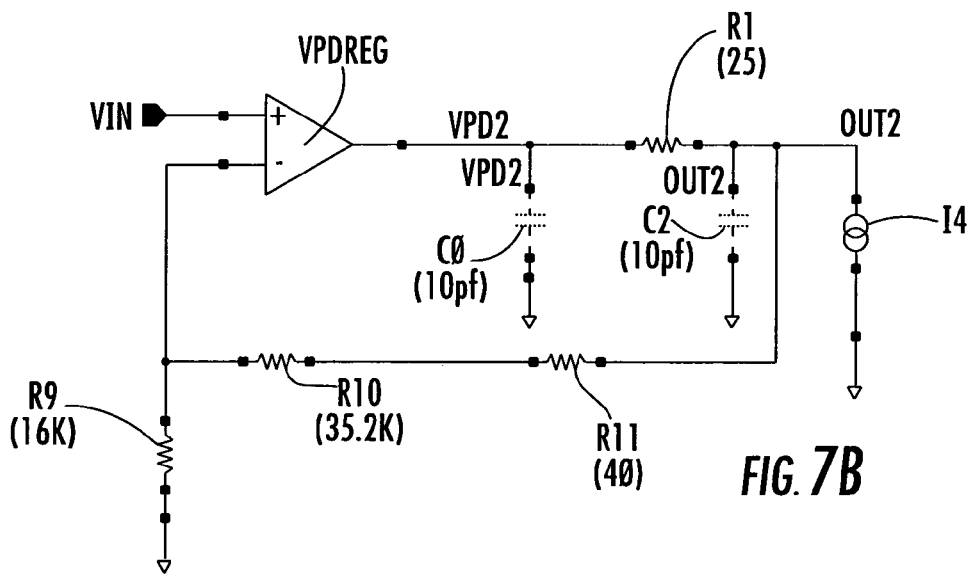
Figure 8A:
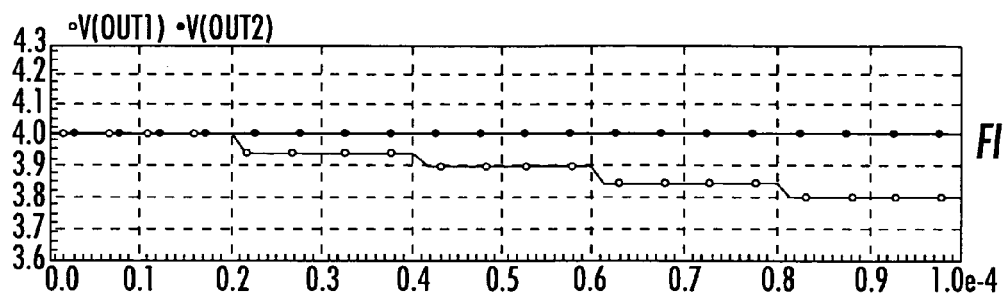
FIGS. 8A–8C are graphs respectively showing the evolution of voltage signals and current in a device according to the invention over time compared to a prior art device.
Figure 8B:
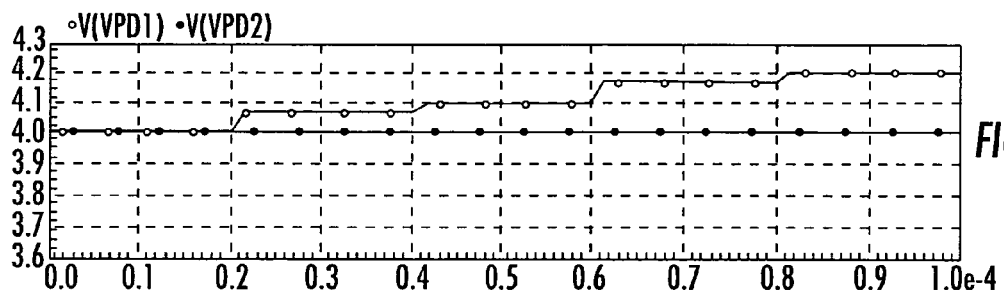
Figure 8C:
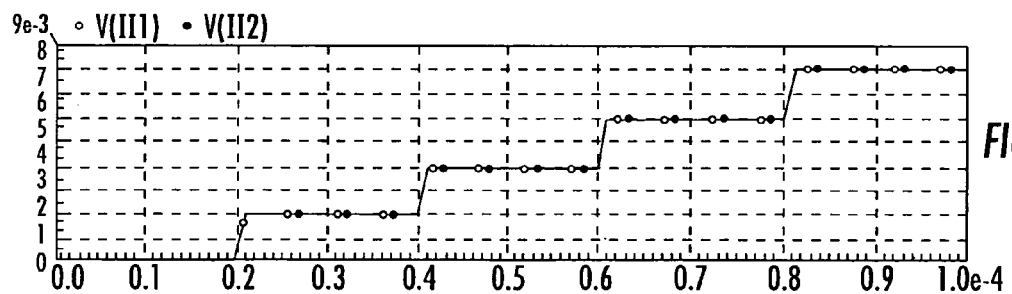

FIGS. 7A and 7B are schematic diagrams respectively illustrating a prior art circuit (i.e., similar to the one illustrated in FIG. 2) and a circuit in accordance with the present invention (i.e., similar to the one illustrated in FIG. 5). Moreover, FIGS. 8A, 8B and 8C illustrate the evolutions of voltage values according to the current load for these circuits for comparison purposes, with the prior art results illustrated with short dashed line (and "◊" symbols), and the results of the present invention illustrated with solid or continuous lines (and "+" symbols).

Figure 9A:
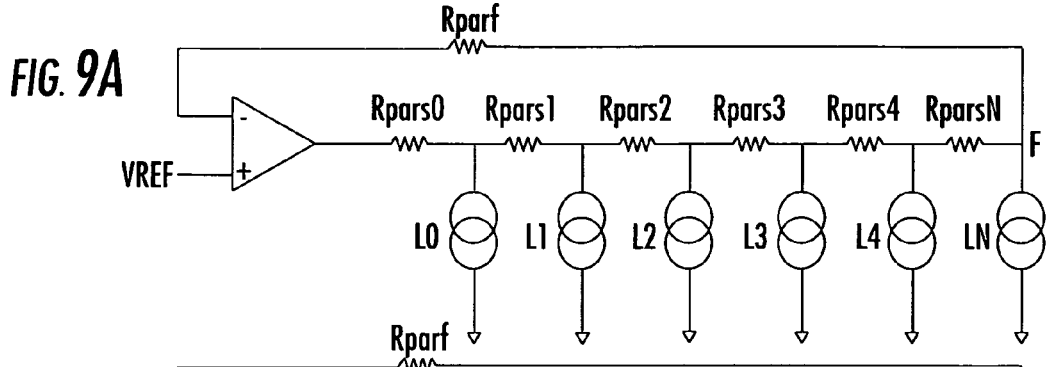
FIGS. 9A–9D are schematic diagrams illustrating an exemplary implementation of the present invention for a plurality of loads distributed along a resistive line.
Figure 9B:
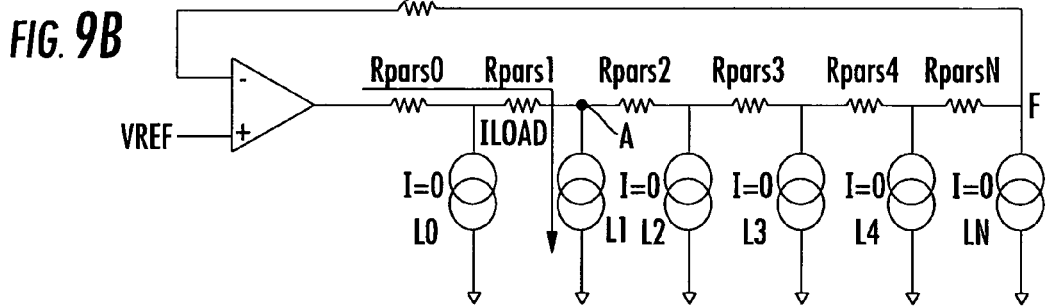

The methods and devices according to the present invention are particularly effective in situations requiring a plurality of loads belonging to a same resistive line (and not necessarily memory cells connected to a same metal line), which are to be supplied with constant regulated voltages. Turning to the example illustrated in FIG. 9A, load sources L0, L1, ..., LN are spaced from one another (and thus have different routing resistances Rpars0, Rpars1, ..., RparsN, associated therewith) and are to be supplied with different voltages VREF.

In this case line 4 is a supply line which, starting from the output of the regulator 2, distributes the voltage to the loads across the routing resistances Rpars0, Rpars1, ..., RparsN associated with each load. A node F near the farthest load LN from the regulator is the node to be used for the feedback connection 5 of the regulator 2.

For the present example it will be assumed that only load L1 absorbs current (i.e., the others are off or otherwise absorb no current). On the node A connected to load L1 the desired voltage VREF is reached. On the right of the node A there is no current absorption, since the current generators to the right thereof are off. Moreover, the inverting input of the regulator 2 has a high impedance since it is generally formed by the gate terminal of a MOS transistor.

Figure 9C:
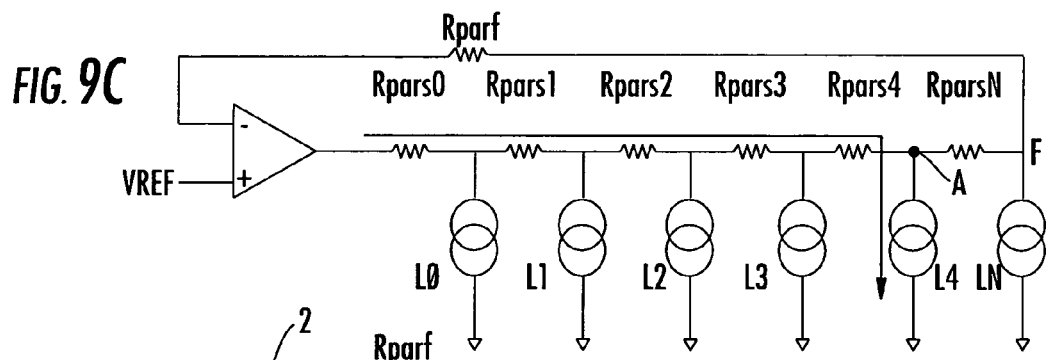
Figure 9D:
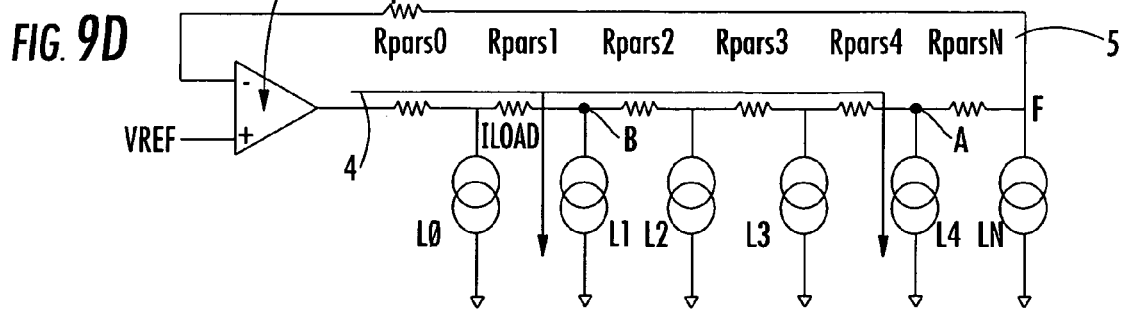

If the load L1 is now deactivated, and in the meantime another load is enabled (e.g., load L4), the voltage VREF reaches the node to which the load L4 is connected, which is also indicated in FIG. 9C as node A. Thus, the voltage supplied to each single load is stable against changes which occur from time to time.

Accordingly, the method and the devices according to the present invention solve the technical problem noted above and allow the voltages at the drain memory cell terminals to be stabilized during the multi-level Flash memory programming steps. Moreover, the present invention, by keeping the value of these voltages stable during programming, allows gate pulses applied during the programming algorithm to effectively realize a threshold voltage jump which is constant for each pulse with various programming patterns.

That which is claimed is:

1. A method for programming an electronic memory device comprising a plurality of non-volatile memory cells each having a conduction terminal associated therewith, a voltage regulator having at least one input and an output, and a conductor having a first end connected to the output of the voltage regulator and a second end connected to a common circuit node also connected to each of the conduction terminals, the method comprising:
    outputting a first voltage from the output of the voltage regulator to the first end of the conductor, the conductor having a parasitic intrinsic resistance associated therewith; and
    feeding back a second voltage from the common circuit node along a feedback path to the at least one input of the voltage regulator.

2. The method of claim 1 wherein the feedback path comprises a resistor and also has a parasitic feedback path resistance associated therewith.

3. The method of claim 1 wherein the at least one input comprises an inverting input and a non-inverting input, wherein the feedback path is connected to the inverting input, and wherein the non-inverting input is connected to a reference voltage.

4. The method of claim 1 further comprising buffering the first voltage between the output of the voltage regulator and the common circuit node.

5. The method of claim 1 wherein the non-volatile memory cells comprise multi-level non-volatile memory cells.

6. The method of claim 1 wherein the conductor comprises a metal line.

7. A method for supplying power to a load from among a plurality of loads each connected to a conductor having first and second ends, the method comprising:
    applying a first voltage to the first end of the conductor using a voltage regulator, the voltage regulator having at least one input and an output and being connected to the first end of the conductor at the output, and the conductor having at least one routing resistance associated therewith; and
    feeding back a second voltage from the second end of the conductor along a feedback path to the at least one input of the voltage regulator.

8. The method of claim 7 wherein the loads are spaced apart along the conductor, and wherein the at least one routing resistance comprises a plurality of routing resistances each associated with a respective load.

9. The method of claim 7 wherein the feedback path has a parasitic resistance associated therewith.

10. The method of claim 7 wherein the conductor comprises a metal line.

11. An electronic memory device comprising:
    a programming circuit having at least one input and an output;
    a plurality of non-volatile memory cells each having a conduction terminal associated therewith;
    a conductor having a first end connected to the output of said programming circuit and a second end connected to a common circuit node, the common circuit node also being connected to each of the conduction terminals, the conductor having a parasitic intrinsic resistance associated therewith; and
    a feedback path connected between the common circuit node and the at least one input of said programming circuit.

12. The electronic memory device of claim 11 wherein said programming circuit comprises a voltage regulator.

13. The electronic memory device of claim 11 wherein said feedback path comprises a resistor and also has a parasitic feedback path resistance associated therewith.

14. The electronic memory device of claim 11 wherein the at least one input comprises an inverting input and a non-inverting input, wherein said feedback path is connected to the inverting input, and wherein the non-inverting input is connected to a reference voltage.

15. The electronic memory device of claim 11 further comprising a buffer connected to the output of said programming circuit.

16. The electronic memory device of claim 11 wherein said non-volatile memory cells comprise multi-level non-volatile memory cells.

17. The electronic memory device of claim 11 wherein said conductor comprises a metal line.

18. The electronic memory device of claim 11 wherein each memory cell comprises at least one floating gate transistor having a source terminal, a drain terminal, and a gate terminal, and wherein the drain terminal of each floating gate transistor is connected to the common circuit node.

19. The electronic memory device of claim 11 wherein said programming circuit, said non-volatile memory cells, said conductor, and said feedback path are implemented in a semiconductor device.

* * * * *